United States Patent [19]

Sanner

[11] Patent Number: 4,879,718
[45] Date of Patent: Nov. 7, 1989

[54] SCAN DATA PATH COUPLING

[75] Inventor: Martin W. Sanner, San Jose, Calif.

[73] Assignee: Tandem Computers Incorporated, Cupertino, Calif.

[21] Appl. No.: 126,998

[22] Filed: Nov. 30, 1987

[51] Int. Cl.[4] ............................................. G01R 31/28
[52] U.S. Cl. .................................... 371/22.3; 377/54; 377/67; 307/602; 307/272.2; 324/73 R
[58] Field of Search ............... 377/26, 44, 54, 60, 377/70, 64, 73, 67, 75, 78, 77, 80, 81; 307/269, 272.1, 590, 591, 602, 606, 15, 25; 328/63, 72, 71, 75; 324/73 R

[56] References Cited

U.S. PATENT DOCUMENTS

| | | |
|---|---|---|
| 3,753,241 | 8/1973 | Bayne ..................................... 377/81 |
| 3,783,254 | 1/1974 | Eichelberger .................... 307/272.1 |
| 3,786,440 | 1/1974 | Toyen .................................... 377/26 |
| 3,916,323 | 10/1975 | Moriyama et al. .................... 377/54 |
| 4,034,356 | 7/1977 | Howley et al. ...................... 307/269 |
| 4,039,960 | 5/1977 | Clark .................................... 307/269 |
| 4,070,630 | 1/1978 | Hepworth et al. ................. 307/269 |
| 4,277,699 | 7/1981 | Brown et al. ......................... 377/81 |
| 4,692,633 | 9/1987 | Ngai et al. ........................... 307/269 |
| 4,697,279 | 9/1987 | Baratti et al. ..................... 307/272.1 |
| 4,701,917 | 10/1987 | Jones et al. ........................... 371/25 |
| 4,733,405 | 3/1988 | Shimizume et al. ................. 371/25 |
| 4,745,302 | 5/1988 | Hanawa et al. ..................... 307/269 |

FOREIGN PATENT DOCUMENTS 0106238 7/1982 Japan ..................................... 377/54

Primary Examiner—Stanley D. Miller
Assistant Examiner—Tai V. Duong
Attorney, Agent, or Firm—Townsend and Townsend

[57] ABSTRACT

Apparatus is disclosed for forming scan data path subchains from the elemental memory units of a digital system, and interconnecting the scan data path subchains to form an extended serial shift register for scan testing. The method and apparatus for forming the interconnections ensures that data is passed from one subchain to another without data being lost due to clocking irregularities.

3 Claims, 1 Drawing Sheet

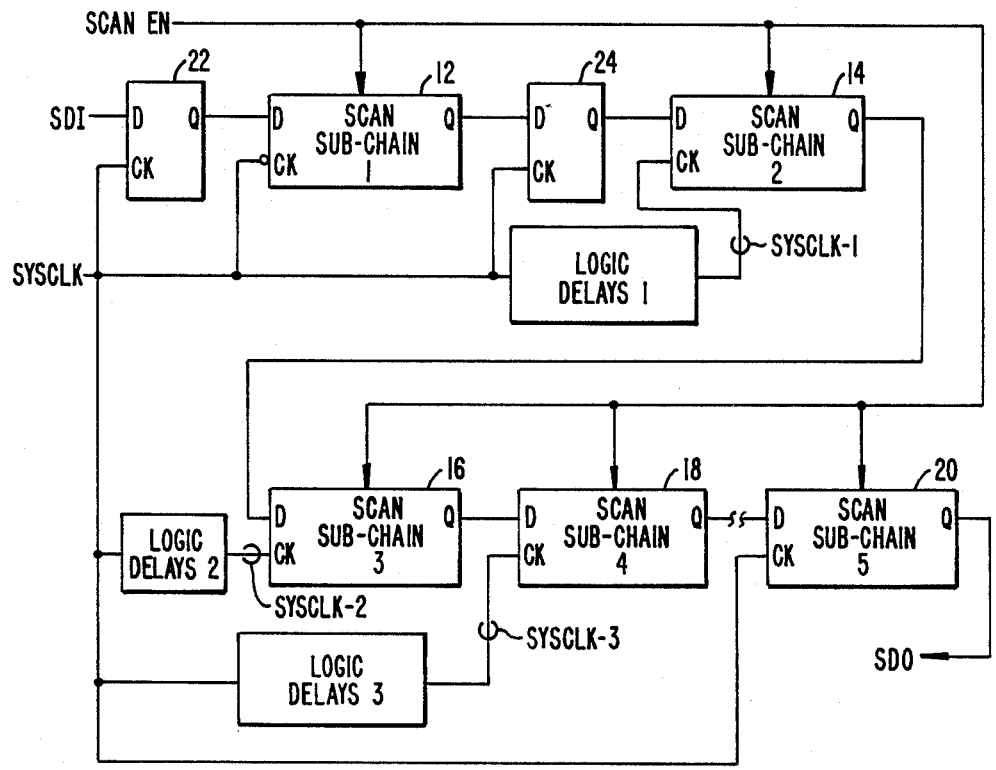
FIG._1.
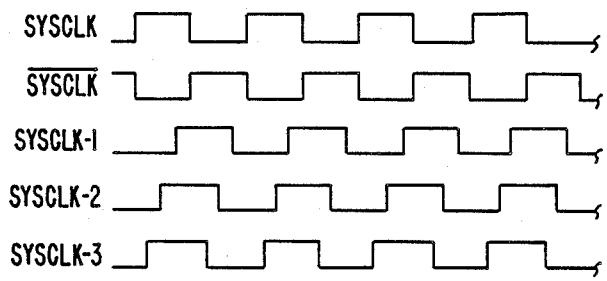
FIG._2.

SCAN DATA PATH COUPLING

BACKGROUND OF THE INVENTION

The present invention is directed generally to testing digital systems in which scan control apparatus produces sequences of test patterns that are shifted ("scanned") into and out of the system, producing result signatures that provide an indication of whether or not the system will function without fault. More specifically, the invention relates to formation of an extended serial shift register, from the elemental memory units used to implement the flip-flops, counters latches, registers, and the like, of the digital system. The extended serial shift register so formed then operates to receive the test patterns during "scan" testing. The invention relates specifically to interconnecting subportions of the extended serial shift register to avoid data loss through clocking delays.

Digital or logic systems have often been tested by applying a variety of test signals to the system, and monitoring the output signals produced in response. Adding to this technique, logic systems have also been designed to incorporate elemental memory units or stages (e.g., flip-flops) that can be selected to function in one of two modes: A first mode in which they operate normally within the system, and a second mode in which the number of elemental memory units are connected in series to form an extended shift register or, as more commonly referred to, a "scan line" for receiving test patterns. Good patterns are then scanned into and out of scan lines, the output test patterns analyzed (usually by comparing them to known or standard patterns). to determine the operability of the stages and interconnections of the tested logic.

Typically, the scannable elemental memory units share a common clock signal. However, problems can arise when a single, long scan line is sought to be configured for scan tests. The common clock signal used to clock the scan line will be communicated through various other and logic elements, arriving at certain portions of the scan line delayed, relative other portions, and creating the possibility of clocking irregularities that can result in possible corruption of the data that will be scanned into the scan line.

One technique around this problem is to form a number of scan lines, each parallel to one another, each being clocked by one or another version of the scan clock. However, using multiple scan lines complicates testing.

SUMMARY OF THE INVENTION

Accordingly, there is presented a method for interconnecting the elementary memory units of a digital system in a manner that forms a single extended shift register, or scan line, capable of being clocked from a common digital clock source.

According to the present invention, the elemental memory units of a digital system are, during scan testing, configured to form a number of scan subchains. i.e., a number of extended serial shift registers, each having a data input and each being clocked by a scan clock, or a delayed version of the scan clock. The subchains are intercoupled to form a single extended serial shift register, and are located in the extended serial shift register so formed according to the version of the scan clock with which they are clocked: The scan subchains receiving the more delayed versions of the scan clock are placed earlier in the extended serial shift register, while the subchains receiving lesser delayed versions of the scan clock appear later in the extended serial shift register.

In addition, when there is a substantial difference between the versions of the scan clock received by adjacent subchains so that the output from the upstream subchain changes at or about the time the next subchain in line is clocked to receive data, giving rise to the possibility of setup time violations, race conditions, or other causes of potential or real data corruption, a "de-skew" flip-flop is inserted between the two subchains. The de-skew flip-flop is clocked by the version of the scan clock that is compatible with one or the other of the subchains, thereby isolating the upstream subchain from the downstream subchain.

Among the advantages achieved by the present invention is the fact that scan testing can be accomplished by configuring the elemental storage units of a digital system as a single extended serial shift register, making the control of the scan test less complex than would be if there were multiple, parallel shift registers.

These and other advantages and aspects of the invention will become apparent to those skilled in the art upon reading of the following detailed description of invention, which should be taken in conjunction with the accompanying drawings. drawings.

BRIEF DESCRIPTION OF THE DRAWINGS

FIG. 1 illustrates interconnection of a plurality of memory element units of a digital system according to the present invention; and FIG. 2 is a timing diagram illustrating the versions of a clock signal applied to portions of the interconnection shown in FIG. 1.

DETAILED DESCRIPTION OF THE INVENTION

The present state of digital electronics today is that digital systems almost universally incorporate integrated circuit elements or chips, each carrying a large, if not very large number of logic elements. Often, these integrated circuit chips carry thousands and tens of thousands logic elements such as, for example, AND gates. OR gates, and elemental storage units in the form of individual flip-flops, latches, registers, counters, and the like.

One form of testing the circuitry carried by such integrated chips involves what is known in the art as a "scan testing" technique. According to this technique, certain (if not most all) of the elemental storage units on the chip are designed so that in absence of a scan enable signal, for example, they operate in "normal" mode, functioning as a part of the overall design in the circuitry, formed on the chip. However, when the scan enable signal is asserted, the elemental storage units are reconfigured to form extended serial shift registers that can be synchronously clocked to receive a pseudo-random test pattern. Continuing the technique, once the test pattern is in place, the scan enable signal is deasserted, and the digital system operated in its normal configuration for one clock pulse. The scan enable signal is then reasserted, and the test pattern then in the extended serial shift registers shifted (or "scanned") out for examination. It is to this type of testing that the present invention is directed.

Turning now to FIG. 1, there is illustrated an extended serial shift register, or scan line, designated generally with the reference numeral 10. the scan line 10 is formed, when a SCAN EN is asserted, from the elemental memory units of a digital system (not shown). and is shown here as including scan subchains 12, 14, 16, 18, 20, and input flip-flop 22.

The input flip-flop 22, and the scan subchains 12, ..., 20 have clock (CK) inputs at which is received a clock signal for clocking each of the elemental memory units forming the subchain. The elemental memory units that form the subchain 12 are of the type that receive data (and the output changes) on a falling or negative-going edge of the clock signal applied thereto—as indicated by the bubble at the CK input of the subchain 22. All other subchains, as well as the input flip-flop 22 and the de-skew flip-flop 24, accept data, and their outputs change, on the rising or positive-going state transition of the clock signal applied thereto.

As FIG. 1 further illustrates, a system clock (SYSCLK) is applied directly to the CK inputs of subchains 12 and 20 as well as flip-flops 22. 24. Also illustrated in FIG. 1 are logic delays 1, 2, 3, which represent the delay introduced by various combinatorial logic elements through which the SYSCLK signal must travel to reach the CK input of various of the subchains. Thus, delayed versions of SYSCLK are produced by the logic delays 1, 2. 3 in a form of SYSCLK-1, SYSCLK-2, SYSCLK-3, respectively. These versions of SYSCLK, as well as SYSCLK and $\overline{\text{SYSCLK}}$ (which, in effect, clocks the subchain 12) are illustrated in FIG. 2, to show the phase relationships between SYSCLK and its various versions. Note that each rising or positive-going state transition of SYSCLK is followed first by that of SYSCLK-3, then SYSCLK-2, and then SYSCLK-1.

According to the present invention, placement of the subchains 12, ..., 20 in the overall scan line formed when SCAN EN is asserted is determined by the version of SYSCLK the subchain receives. Those subchains that receive the least delayed version of the scan line. Thus, the subchain 20, which receives an undelayed version of SYSCLK, is located at the end of the scan line located nearer the end of the scan line. The SYSCLK-3 version of SYSCLK. which as FIG. 2 illustrates is the least delayed (by the logic delays 3) version of SYSCLK is received by the subchain 18, placing it next in line, immediately upstream of the subchain 20. Upstream from subchain 18 is subchain 16, which receives a version of SYSCLK delayed a bit more than SYSCLK-3 but not as much as SYSCLK-1: and subchain 14 is immediately upstream of subchain 16, placed there by SYSCLK-1 (and its relation to SYSCLK FIG. 2). Finally, at the front of the string of subchains is subchain 12, so located by receiving, in effect, the most delayed version of SYSCLK. in the form of $\overline{\text{SYSCLK}}$.

In operation, the SCAN EN signal is asserted, configuring the various subchains 12, ..., 20 as shown in FIG. 1. A randomized (i.e., pseudo-random) bit pattern is applied to a scan data input (SDI) signal line which is coupled to the data (D) of the flip-flop 22, and the SYSCLK signal is asserted, applying a number of pulses sufficient to load the extended serial shift register with the test pattern. The SCAN EN signal is deasserted, the system (i.e., the elemental memory units) clocked by a single pulse. SCAN EN reasserted, and SYSCLK applied to shift or scan the test pattern out as a serial data output (SDO) signal.

When SCAN EN is asserted, and the test pattern is being scanned into or out of the extended serial shift register 10 by SYSCLK. note that the subchains near the end of the line will be clocked before upstream subchain, by reason of the lesser delayed clocks. This assures that no setup time problems occur between the output (Q) of an upstream subchain and the data input (D) of an immediately following subchain.

At times, however, it may be that an upstream subchain is triggered on a state change of SYSCLK (or a version thereof) sufficiently different from the state transition used to trigger an immediately successive subchain. For example, referring to FIG. 1 and assuming for the moment the absence of the de-skew flip-flop 24 the subchain 12, as explained above, accepts data at its data input D. transfers data internally, and experiences state changes at the data output (Q) upon the negative-going or falling state transitions of SYSCLK (i.e.. the positive-going state transitions of $\overline{\text{SYSCLK}}$. The immediately downstream subchain 14 (remember, the de-skew flip-flop 24, for the moment, is not present) undergoes state changes upon the positive going state changes of SYSCLK (albeit delayed by the logic delays 1). This will periodically cause two immediately adjacent elemental memory units to contain the same data: that is, after the state of the elemental memory unit that forms the output of the subchain 12 changes (with the negative going state transition of SYSCLK). the state of that elemental memory unit will be accepted and stored in the first elemental memory unit forming the input of the subchain 14. Thus, the last stage of the subchain 12, and the first stage of the subchain 14, will have the same data. This is bad scan testing technique.

Accordingly, the de-skew flip-flop 24 is inserted therebetween to isolate the last stage of the subchain 12 from the first stage of the subchain 14, and insuring correct sequencing of data between the two subchains. As explained, without the de-skew flip-flop 24, adjacent bit pattern mirroring can occur, or there could be a data setup/hold time violation at the scan chain 14 because for the clock for the subchain 12 occurs before that of the subchain 14.

I claim:

1. In a digital logic unit of the type including a plurality of logic elements, such as AND gates and OR gates, and elemental memory units (MUs), such a flip-flops, latches, registers, and counters, that are connected to function as a part of the logic unit during a normal mode, where the MUs are serially connected to form the register elements of a scan line shift register (SR) during a scan mode, where a system clock signal (SCLK) is received at an SCLK input, and where the scan SR is used to shift a scan data pattern, received at a scan SR input, into the SR register elements during the scan mode to test the operability of the stages and interconnections of the logic unit, a system for preventing corruption of the scan data pattern comprising:

means, coupled to every SR register element, for serially connecting the SR register elements during the scan mode with each SR register element having a clock input for receiving a delayed version of SCLK with the magnitude of the delay relative to the undelayed SCLK signal determined by the delays induced by the particular logic elements connecting the SCLK input port to said clock input of a particular SR register element;

a first scan sub-chain of serially connected SR register elements including only SR register elements receiving a delayed version of SCLK having a delay of a first fixed magnitude;

a second scan sub-chain of serially connected SR register elements including only SR register elements receiving a delayed version of SCLK having a delay of a second fixed magnitude, with said first magnitude being greater than said second magnitude and with said first scan sub-chain being nearer to the scan SR input than said second scan sub-chain.

2. The system of claim 1 wherein an input scan sub-chain nearest the input of the scan SR receives an inverted SYCLK signal and a last scan sub-chain furthest from the input of the scan SR receives an undelayed SYCLK signal.

3. The system of claim 2 further comprising:

a de-skew memory element receiving said SYCLK clock signal disposed between said input scan sub-chain and an immediately following scan sub-chain to prevent scan data pattern corruption in the event that the version of SYCLK received by said immediately following scan sub-chain is substantially equal to the inverted SYCLK signal.

* * * * *